(12) United States Patent
Higashi et al.

(10) Patent No.: US 7,336,135 B2
(45) Date of Patent: Feb. 26, 2008

(54) OSCILLATOR AND SEMICONDUCTOR DEVICE

(75) Inventors: Hirohito Higashi, Kawasaki (JP); Hideki Ishida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 306 days.

(21) Appl. No.: 11/024,705

(22) Filed: Dec. 30, 2004

(65) Prior Publication Data
US 2005/0265053 A1 Dec. 1, 2005

(30) Foreign Application Priority Data
May 28, 2004 (JP) ............... 2004-158619

(51) Int. Cl.
*H03B 5/12* (2006.01)
*H02B 37/00* (2006.01)
(52) U.S. Cl. .............. 331/108 B; 331/45; 331/135
(58) Field of Classification Search ............ 363/9, 363/10, 148, 152, 156; 331/108 B, 135, 331/137, 165, 175, 181–183, 57, 45
See application file for complete search history.

(56) References Cited

U.S. PATENT DOCUMENTS

| | | | | |
|---|---|---|---|---|
| 5,581,215 | A * | 12/1996 | Ogasawara | 331/45 |
| 6,617,936 | B2 * | 9/2003 | Dally et al. | 331/57 |
| 7,078,979 | B2 * | 7/2006 | Dally et al. | 331/57 |
| 7,170,357 | B1 * | 1/2007 | Driscoll et al. | 331/158 |

FOREIGN PATENT DOCUMENTS

| | | |
|---|---|---|
| JP | 06-152335 | 5/1994 |
| JP | HEI-6-152335 | 5/1994 |
| JP | 06-188634 | 7/1994 |
| JP | HEI-6-188634 | 7/1994 |
| WO | 02/061937 A1 | 8/2002 |

OTHER PUBLICATIONS

Behzad Razavi, *Design of Integrated Circuits for Optical Communications*, McGraw-Hill, 2002, front and back cover, pp. 234-241.
Marc Tiebout, "Low-Power Low-Phase-Noise Differentially Tuned Quadrature VCO Design in Standard CMOS," IEEE Journal of Solid-State Circuits, vol. 36, No. 7, Jul. 2001, pp. 1018-1024.

* cited by examiner

*Primary Examiner*—Matthew V. Nguyen
(74) *Attorney, Agent, or Firm*—Arent Fox LLP

(57) ABSTRACT

An oscillator for ensuring the phase relationship between two resonant circuits coupled by a coupling circuit. A first resonant circuit outputs two signals having different phases, and a second resonant circuit outputs two signals having different phases. The coupling circuit includes a plurality of inverters connected in a ring manner, and couples the first resonant circuit and the second resonant circuit such that the two signals output from the first resonant circuit and the two signals output from the second resonant circuit have different phases. A filter is connected to the input side of each of the plurality of inverters. With this structure, a signal output from each of the plurality of inverters has either a phase lead or a phase lag according to the phase characteristics of the corresponding filter, and thus the phase relationship between the first resonant circuit and the second resonant circuit is ensured.

11 Claims, 13 Drawing Sheets

OSCILLATOR AND SEMICONDUCTOR DEVICE

CROSS-REFERENCE TO RELATED APPLICATIONS

This application is based upon and claims the benefits of priority from the prior Japanese Patent Application No. 2004-158619, filed on May 28, 2004, the entire contents of which are incorporated herein by reference.

BACKGROUND OF THE INVENTION

1. Field of the Invention

The present invention relates to oscillators and semiconductor devices, and particularly to an oscillator and a semiconductor device which output four-phase signals.

2. Description of the Related Art

Conventionally, there have been oscillators which output multiple-phase signals (the oscillators are disclosed, for example, in paragraph numbers 0015 to 0026 and FIG. 1 in Japanese Unexamined Patent Publication No.6-152335 (1994), and paragraph numbers 0027 to 0029 and FIG. 1 in Japanese Unexamined Patent Publication No. 6-188634 (1994)). There have also been voltage-controlled oscillators (LC-VCO) which are formed of two LC resonant circuits and an inverter ring which couples the resonant circuits, and which output four-phase signals (the oscillators are disclosed, for example, in Behzad Razavi, "Design of Integrated Circuits for Optical Communications," first edition, United States of America, McGraw-Hill, Sep. 12, 2002, pp. 235-241, and Marc Tiebout, "Low-Power Low-Phase-Noise Differentially Tuned Quadrature VCO Design in Standard CMOS," IEEE Journal of Solid-State Circuits, Vol. 36, No. 7, July, 2001, pp. 1018-1024).

FIG. 13 is a schematic diagram of a conventional oscillator formed of LC resonant circuits and an inverter ring.

As shown in FIG. 13, the oscillator has LC resonant circuits 100 and 110, and a coupling circuit 120.

The LC resonant circuits 100 and 110 each output clock signals having a phase difference of 180 degrees. The coupling circuit 120 couples the clock signals output from the LC resonant circuits 100 and 110 so as to have phase relationships of 0 degrees, 90 degrees, 180 degrees, and 270 degrees.

The LC resonant circuit 100 includes inverters Z101 and Z102, an inductor L101, and a variable capacitor VC101. The inverters Z101 and Z102 are turned on/off at the resonant frequency determined by the inductor L101 and the variable capacitor VC101, and output clock signals having a phase difference of 180 degrees to the coupling circuit 120.

The LC resonant circuit 110 includes inverters Z111 and Z112, an inductor L111, and a variable capacitor VC111. The inverters Z111 and Z112, the inductor L111, and the variable capacitor VC111 have the same parameters as the inverters Z101 and Z102, the inductor L101, and the variable capacitor VC101 in the LC resonant circuit 100. The LC resonant circuit 110 operates in the same way as the LC resonant circuit 100, and outputs clock signals having a phase difference of 180 degrees to the coupling circuit 120.

The variable capacitors VC101 and VC111 change their capacitances according to applied voltages. When the voltages applied to the variable capacitors VC101 and VC111 are controlled, the frequencies of the clock signals output from the LC resonant circuits 100 and 110 are controlled accordingly.

The coupling circuit 120 has inverters Z121 to Z124. The inverters Z121 to Z124 are connected in a ring manner to form an inverter ring. The coupling circuit 120 couples the LC resonant circuit 100 and the LC resonant circuit 110 so as to have a phase difference of 90 degrees between the LC resonant circuits 100 and 110.

When the inverters Z101 and Z102 of the LC resonant circuit 100 output clock signals having phases of 0 degrees and 180 degrees, for example, the inverters Z111 and Z112 of the LC resonant circuit 110 output, for example, clock signals having phases of 90 degrees and 270 degrees, which gain by 90 degrees (0+90=90 and 180+90=270) from the outputs of the LC resonant circuit 100. Alternatively, the inverters Z112 and Z111 output clock signals having phases of 270 degrees and 90 degrees, which lose by 90 degrees (0−90=270 and 180−90=90) from the outputs of the LC resonant circuit 100. From the oscillator, the four-phase clock signals having phases of 0 degrees, 90 degrees, 180 degrees, and 270 degrees are obtained.

If the coupling circuit 120 has a high gain, the oscillator does not oscillate. Therefore, the LC resonant circuits 100 and 110 and the coupling circuit 120 need to have appropriate gains.

The conventional oscillator ensures that the LC resonant circuits 100 and 110 output clock signals having phases of 0 degrees and 180 degrees.

However, it is not ensured by the coupling circuit 120 that the phases of the clock signals output from the LC resonant circuit 110 gain or lose by 90 degrees with respect to the phases of the clock signals output from the LC resonant circuit 100 (it is not ensured that the phase of the output of the inverter Z121 gains by 90 degrees or loses by 90 degrees (gains by 270 degrees) with respect to the phase of the input of the inverter Z121.)

SUMMARY OF THE INVENTION

In view of the foregoing, it is an object of the present invention to provide an oscillator and a semiconductor device which ensure the phase relationship between two resonant circuits coupled by a coupling circuit.

To accomplish the above object, the present invention provides an oscillator for outputting four-phase signals. The oscillator includes a first resonant circuit for outputting two signals having different phases, a second resonant circuit for outputting two signals having different phases, a coupling circuit for coupling the first resonant circuit and the second resonant circuit such that the two signals output from the first resonant circuit and the two signals output from the second resonant circuit have different phases, the coupling circuit including a plurality of inverters connected in a ring manner, and filters each connected to the input side of each of the plurality of inverters.

Additionally, to accomplish the above object, the present invention further provides a semiconductor for outputting four-phase signals. The semiconductor includes a first resonant circuit for outputting two signals having different phases, a second resonant circuit for outputting two signals having different phases, a coupling circuit for coupling the first resonant circuit and the second resonant circuit such that the two signals output from the first resonant circuit and the two signals output from the second resonant circuit have different phases, the coupling circuit including a plurality of inverters connected in a ring manner, and filters each connected to the input side of each of the plurality of inverters.

The above and other objects, features and advantages of the present invention will become apparent from the fol-

DESCRIPTION OF THE PREFERRED EMBODIMENTS

Figure 1:
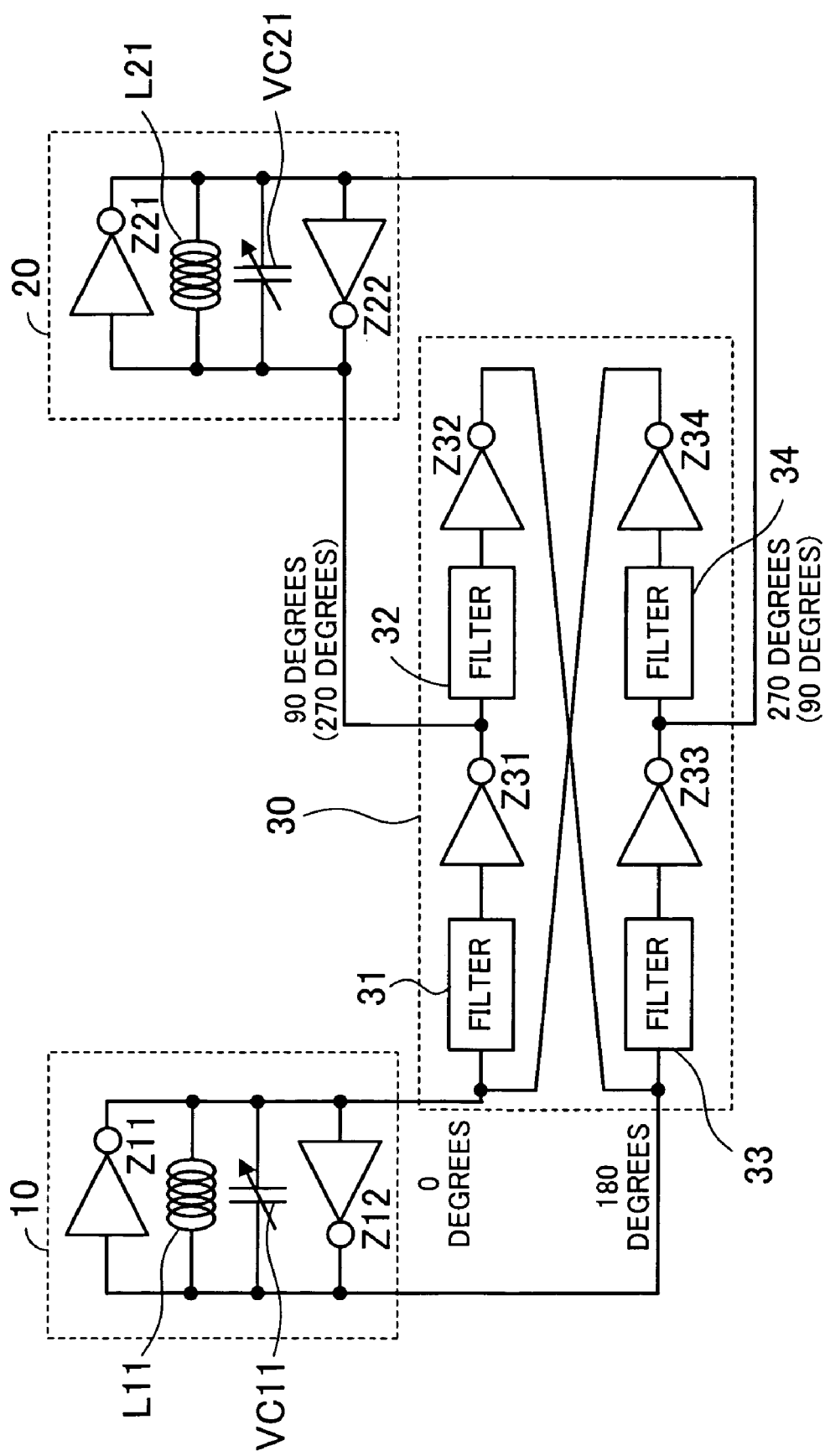
FIG. 1 is a schematic diagram showing the principle of an oscillator according to the present invention.

The principle of the present invention will be described below in detail by referring to the drawings.

FIG. 1 is a schematic diagram showing the principle of an oscillator according to the present invention.

The oscillator shown in FIG. 1 includes a first resonant circuit 10, a second resonant circuit 20, and a coupling circuit 30, and outputs four-phase clock signals. As described later in detail, a reference clock signal having an accurate frequency is required for high-frequency circuits such as a high-speed input and output circuit and a dual synthesizer so as not to malfunction. In the oscillator according to the present invention, either phase leads or phase lags occur and clock signals having a predetermined frequency are output, so that high-frequency circuits such as a high-speed input and output circuit and a dual synthesizer can operate correctly with the clock signals.

The first resonant circuit 10 includes inverters Z11 and Z12, an inductor L11, and a variable capacitor VC11. The inverters Z11 and Z12 are turned on/off at the resonant frequency determined by the inductor L11 and the variable capacitor VC11, and output clock signals having a phase difference of 180 degrees to the coupling circuit 30.

The second resonant circuit 20 includes inverters Z21 and Z22, an inductor L21, and a variable capacitor VC21. The inverters Z21 and Z22, the inductor L21, and the variable capacitor VC21 have the same parameters as the inverters Z11 and Z12, the inductor L11, and the variable capacitor VC11 in the first resonant circuit 10. The second resonant circuit 20 operates in the same way as the first resonant circuit 10, and outputs clock signals having a phase difference of 180 degrees to the coupling circuit 30.

The variable capacitors VC11 and VC21 change their capacitances according to applied voltages. When the voltages applied to the variable capacitors VC11 and VC21 are controlled, the frequencies of the clock signals output from the first resonant circuit 10 and the second resonant circuit 20 are controlled accordingly.

The coupling circuit 30 has inverters Z31 to Z34 and filters 31 to 34. The inverters Z31 to Z34 are connected in a ring manner to form an inverter ring. The filters 31 to 34 are connected to the input sides of the inverters Z31 to Z34, respectively. The coupling circuit 30 couples the first resonant circuit 10 and the second resonant circuit 20 so as to have a phase difference of 90 degrees between the first resonant circuit 10 and the second resonant circuit 20. With this structure, the coupling circuit 30 outputs four-phase clock signals.

A phase shift of 90 degrees between the first resonant circuit 10 and the second resonant circuit 20 leads or lags according to the phase characteristics of the filters 31 to 34. It is assumed, for example, that the filters 31 to 34 have phase characteristics which cause input clock signals to have a phase lead of 0 to 90 degrees. The phase of a clock signal output from the inverter Z31 has a phase lead of 90 degrees with respect to the phase of a clock signal output from the inverter Z11 of the first resonant circuit 10. The phases of the clock signals output from the inverters Z31 to Z34 are 90 degrees, 180 degrees, 270 degrees, and 0 degrees, respectively, when the phase of the clock signal output from the inverter Z11 of the first resonant circuit 10 is set to 0 degrees.

It is assumed that the filters 31 to 34 have phase characteristics which cause the input clock signals to have a phase lag of 0 to 90 degrees. The phase of the clock signal output from the inverter Z31 has a phase lag of 90 degrees with respect to the phase of the clock signal output from the inverter Z11 of the first resonant circuit 10. The phases of the clock signals output from the inverters Z31 to Z34 are 270 degrees, 180 degrees, 90 degree, and 0 degrees, respectively, when the phase of the clock signal output from the inverter Z11 of the first resonant circuit 10 is set to 0 degrees.

To cause a phase lead of 90 degrees, the filters 31 to 34 need to be high-pass filters (HPFs) which change the phase by 90 degrees. To cause a phase lag of 90 degrees, the filters 31 to 34 need to be low-pass filters (LPFs) which change the phase by 90 degrees.

How to determine the time constants of the filters 31 to 34 will be described next.

Figure 2:
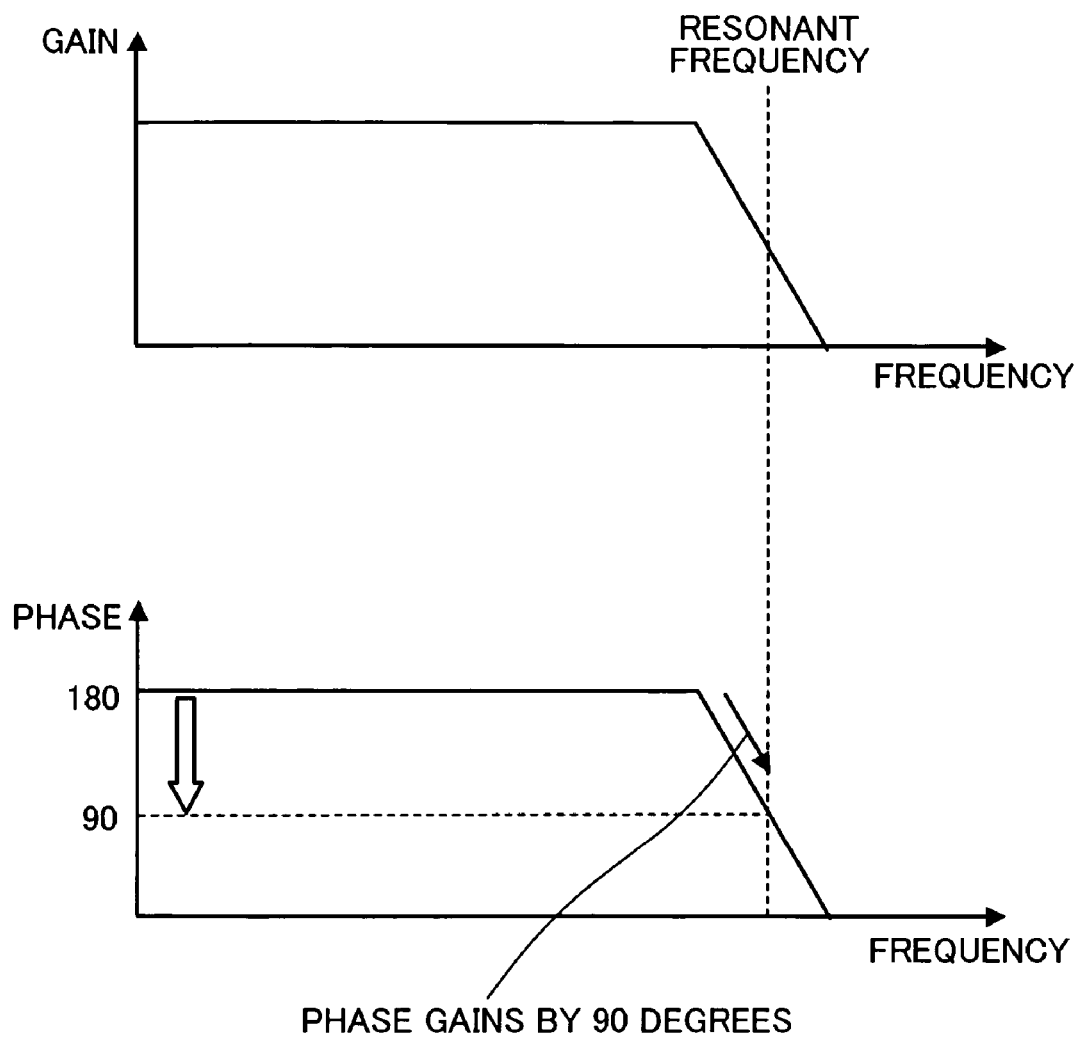
FIG. 2 shows the frequency characteristics and phase characteristics of one set of a filter and an inverter in a coupling circuit.

FIG. 2 shows the frequency characteristics and phase characteristics of one set of a filter and an inverter in the coupling circuit. The upper figure shows the frequency characteristics of the filter 31 and the inverter Z31 shown in FIG. 1, and the lower figure shows their phase characteristics.

The resonant frequency of the oscillator shown in FIG. 1 is determined by $1/(2\pi(LC)^{1/2})$. The time constant is determined, for example, so as to cause a phase lead of 90 degrees at the resonant frequency (assuming that the filter 31 is a HPF).

Then, as shown in FIG. 2, the phase shift of the output of the inverter Z31 with respect to the input of the filter 31 is constant at 180 degrees at frequencies away from the resonant frequency. As the frequency of the clock signal approaches the resonant frequency, the filter 31 changes the phase shift to 90 degrees (180–90 degrees). In other words, the output of the inverter Z31 is changed to have a phase lead of 90 degrees with respect to the input of the filter 31.

In the same way as described above, the time constants of the filter 32, the filter 33, and the filter 34, serving as HPFs, are determined such that the filter 32 and the inverter Z32, the filter 33 and the inverter Z33, and the filter 34 and the inverter Z34 cause a phase lead of 90 degrees. Then, the filter 32 and the inverter Z32, the filter 33 and the inverter Z33, and the filter 34 and the inverter Z34 have the same frequency characteristics and phase characteristics as in FIG. 2. Determining the time constants in this way ensures the phases of the first resonant circuit 10 and the second resonant circuit 20. When the filters 31 to 34 serve as LPFs and the time constants thereof are determined so as to have a phase lag of 90 degrees at the resonant frequency of the oscillator, the phases of the first resonant circuit 10 and the second resonant circuit 20 are also ensured in the same way.

Generally, when a circuit is designed with the use of the phase shift of a filter, the gain generally decreases. However, if the inverters Z31 to Z34 of the coupling circuit 30, the inverters Z11 and Z12 of the first resonant circuit 10, and the inverters Z21 and Z22 of the second resonant circuit 20 have sufficient gain levels, the clock signals can oscillate at the full power-voltage level.

Next, the principle of ensuring the phase leads and lags of the filters 31 to 34 will be described. A detailed circuit of the oscillator shown in FIG. 1 will be described first.

Figure 3:
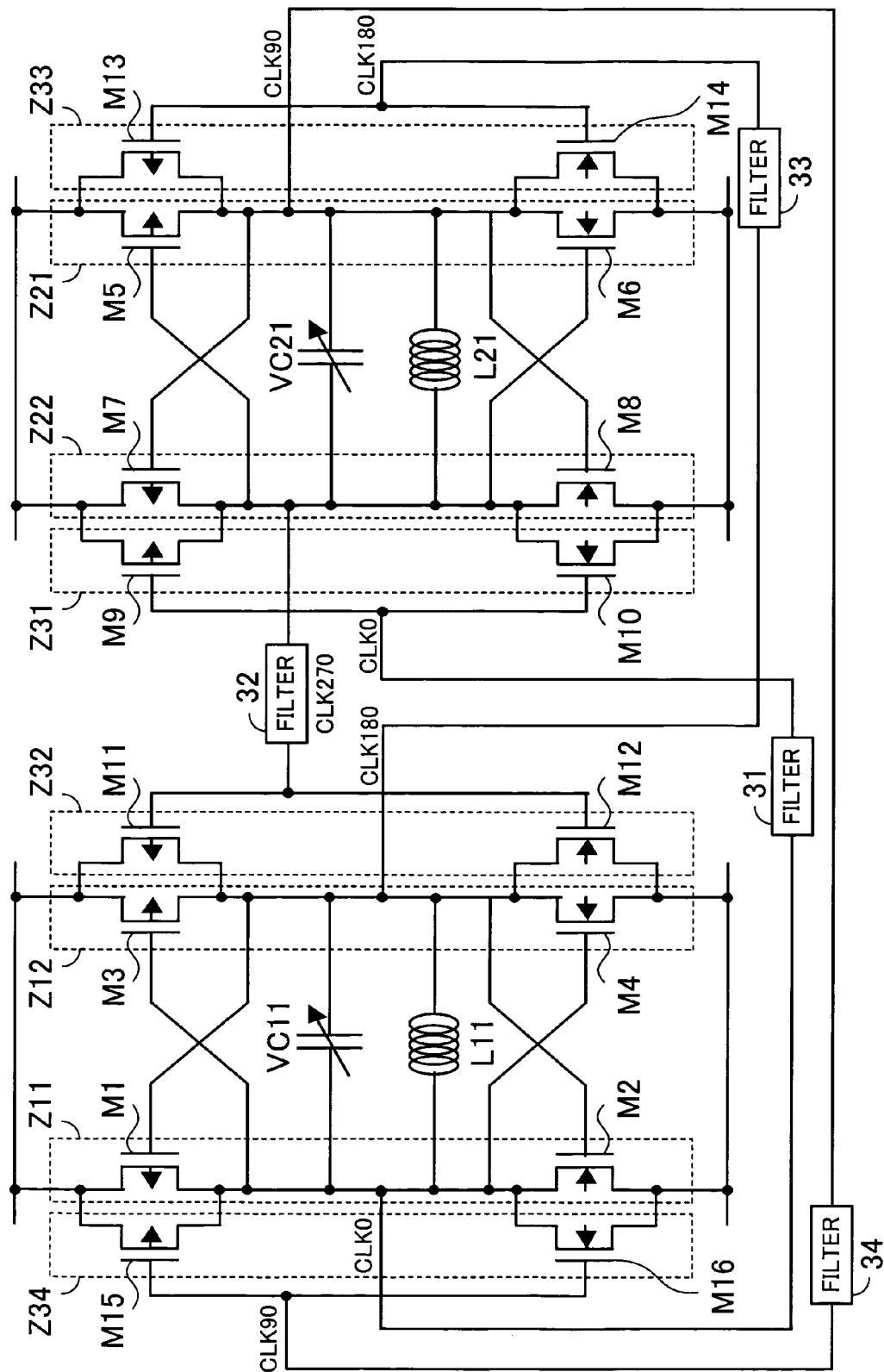
FIG. 3 is a detailed schematic diagram of the oscillator.

FIG. 3 is a detailed schematic diagram of the oscillator.

In FIG. 3, the same symbols as those used in FIG. 1 are assigned to the same elements as those shown in FIG. 1, and a description thereof is omitted. As shown in FIG. 3, the inverter Z11 is formed of a PMOS transistor M1 and an NMOS transistor M2. The inverter Z12 is formed of a PMOS transistor M3 and an NMOS transistor M4. The inverter Z21 is formed of a PMOS transistor M5 and an NMOS transistor M6. The inverter Z22 is formed of a PMOS transistor M7 and an NMOS transistor M8. The inverter Z31 is formed of a PMOS transistor M9 and an NMOS transistor M10. The inverter Z32 is formed of a PMOS transistor M11 and an NMOS transistor M12. The inverter Z33 is formed of a PMOS transistor M13 and an NMOS transistor M14. The inverter Z34 is formed of a PMOS transistor M15 and an NMOS transistor M16.

In FIG. 3, CLK0, CLK90, CLK180, and CLK270 indicate clock-phase relationships. CLK0 indicates a phase of 0 degrees, and CLK90, CLK180, and CLK270 indicate a phase lead of 90 degrees, 180 degrees, and 270 degrees, respectively, relative to CLK0, having a phase of 0 degrees. The phase relationships shown in FIG. 3 indicate those obtained when the filters 31 to 34 serve as LPFs.

Figure 4:
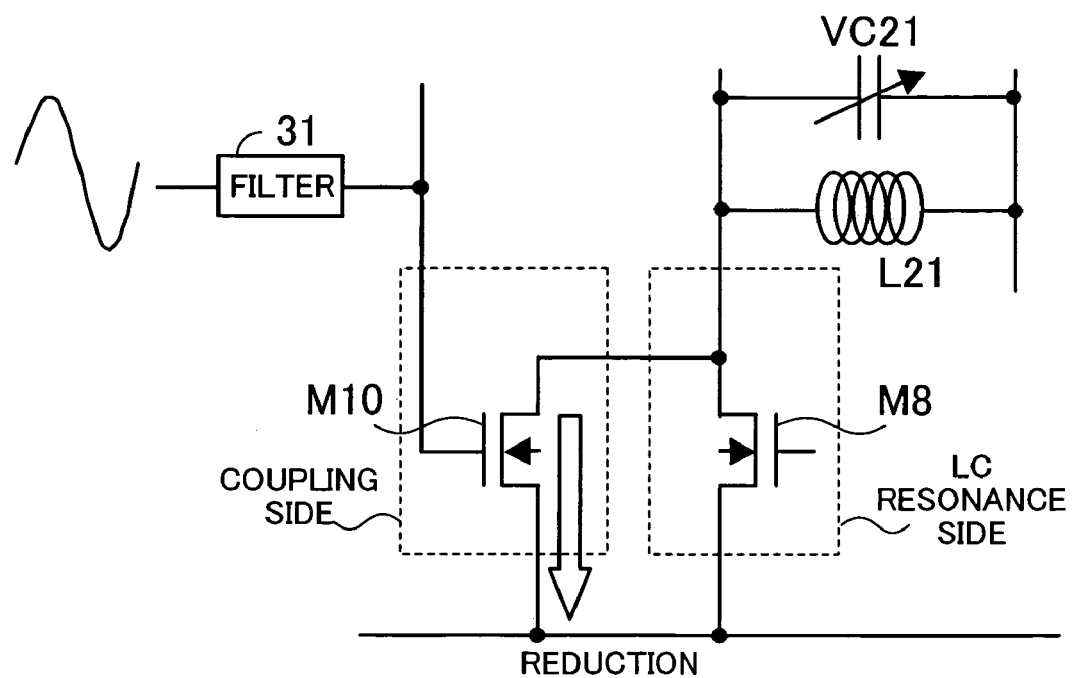
FIG. 4 is used for describing how to ensure a phase.

FIG. 4 is used for describing how a phase is ensured.

A schematic diagram in FIG. 4 is a part of the schematic diagram shown in FIG. 3. The transistor M10 is in the inverter Z31 of the coupling side (the coupling circuit 30), and the transistor M8 is in the inverter Z22 of the LC resonant side (the second resonant circuit 20). In FIG. 4, the same symbols as those used in FIG. 3 are assigned to the same elements as those shown in FIG. 3, and a description thereof is omitted. It is assumed in the same way as in FIG. 3 that the filter 31 serves as a LPF.

When a clock signal having a phase of 270 degrees is to be output from the inverter Z31 (actually from the transistor M10), for example, if it is assumed that the clock signal has come to have a phase of 90 degrees for some reason, such as power on, power noise, or forced reset, the phase cannot be changed to have a phase of 270 degrees in conventional oscillators unless the power is turned off once, or the oscillators are reset. In the oscillator of the present invention, however, since the filter 31 delays the phase by 90 degrees to make the clock signal have a phase of 270 degrees, as described above, the phase is gradually changed from 90 degrees to 270 degrees. This is because the filter 31 adjusts (reduces) the current of the inverter Z31 in the coupling circuit. When the time constant of the filter 31 has been set such that the clock signal has a phase of 90 degrees or less at the resonant frequency, the phase of the output clock signal is always ensured.

The waveforms of clock signals output from the oscillator of the present invention and the conventional oscillator will be described next.

Figure 5:
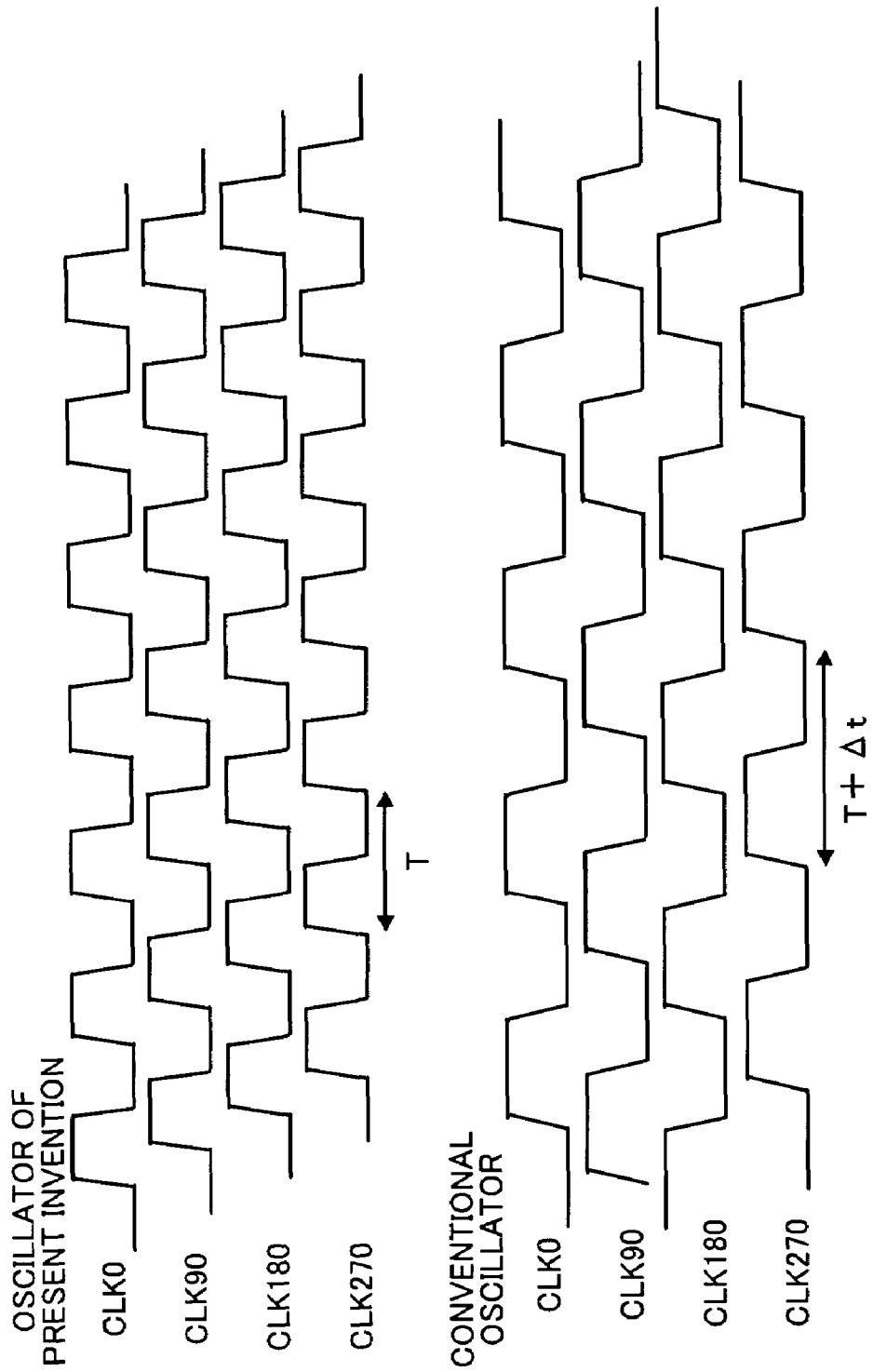
FIG. 5 shows the waveforms of signals output from the oscillator.
Figure 13:
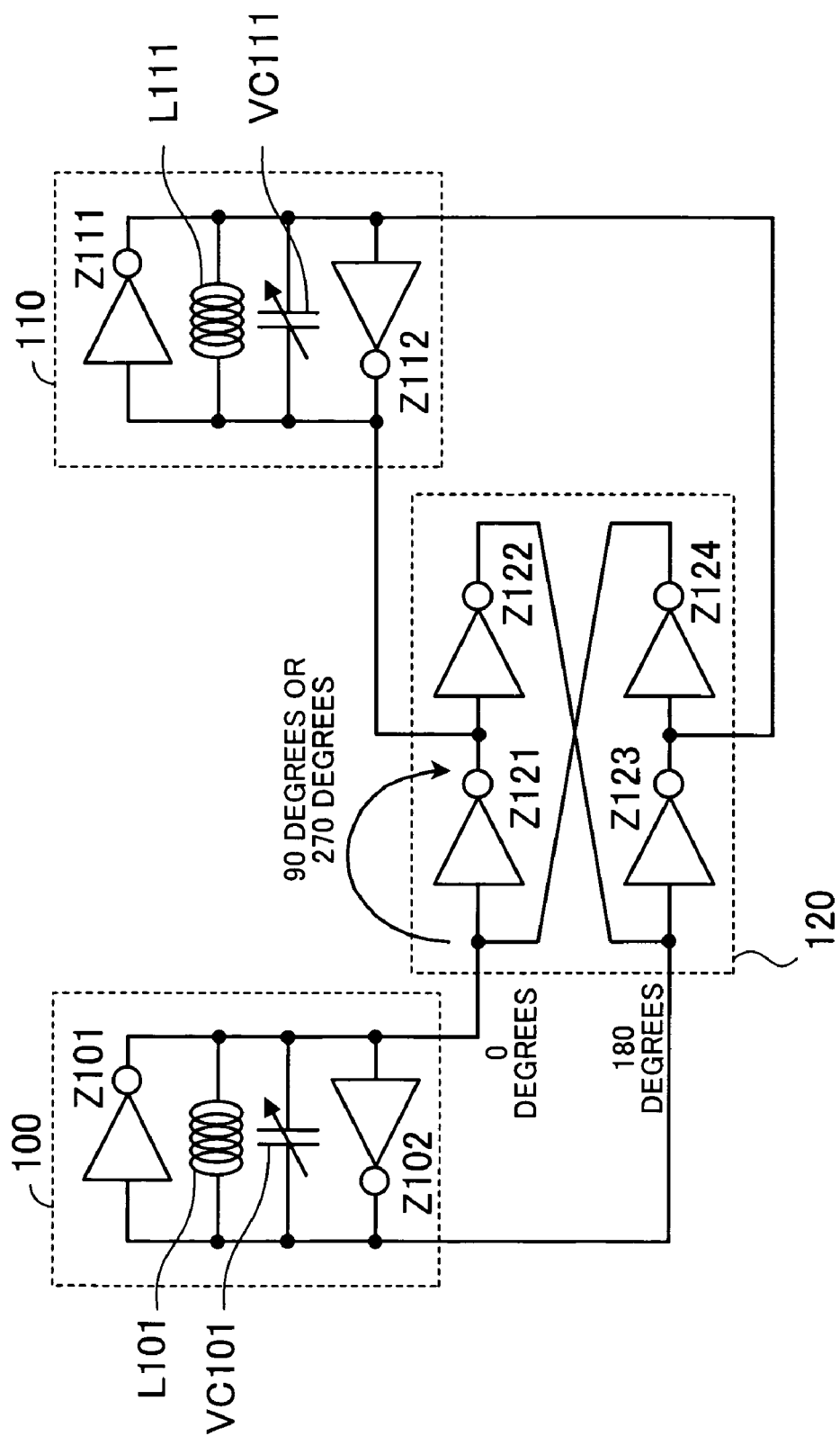
FIG. 13 is a schematic diagram of a conventional oscillator formed of LC resonant circuits and an inverter ring.

FIG. 5 shows the waveforms of the clock signals. The upper part shows the waveforms of the clock signals output from the oscillator of the present invention shown in FIG. 1, and the lower part shows the waveforms of the clock signals output from the conventional oscillator shown in FIG. 13. In FIG. 5, CLK0, CLK90, CLK180, and CLK270 indicate clock signals having phases of 0 degrees, 90 degrees, 180 degrees, and 270 degrees, respectively.

Since it is not clear in the conventional oscillator that the output of the inverter Z121 has a phase lead of 90 degrees or a phase lag of 90 degrees, for example, the inverter ring itself in the coupling circuit 120 may operate as an unexpected loop. Therefore, the inverters Z121 to Z124 of the coupling circuit 120 need to use electric power more than required, and the due oscillation frequency T may be shifted to T+Δt in some cases as shown in FIG. 5. Since the filters 31 to 34 of the oscillator of the present invention determine a phase lead and a phase lag, the oscillator always oscillates at the resonant frequency T.

Example circuits to which the oscillator of the present invention is applied will be described next.

Figure 6:
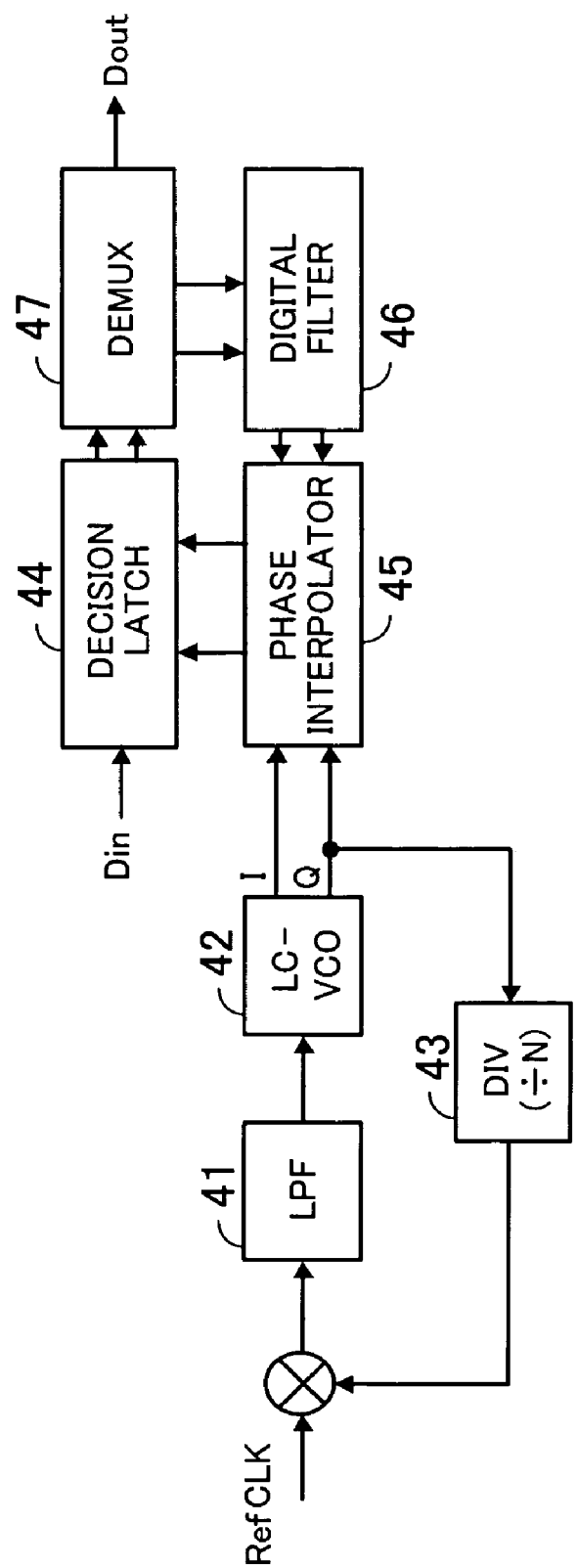
FIG. 6 shows a first example circuit to which the oscillator is applied.

FIG. 6 shows a first example circuit to which the oscillator is applied.

In FIG. 6, a high-speed I/O circuit which employs clock and data recovery (CDR) is shown. The high-speed I/O circuit includes a LPF 41, an LC-VCO 42, a divider (DIV) 43, a decision latch (DL) 44, a phase interpolator (PI) 45, a digital filter (DF) 46, and a demultiplexer (DEMUX) 47.

The LPF 41, the LC-VCO 42, and the DIV 43 form a phase-locked loop (PLL). The oscillator of the present invention serves as the LC-VCO 42 and outputs clock signals having four phases. The clock signals output from the LC-VCO 42 are divided by the DIV 43, and the phase differences with a reference clock signal RefCLK are detected. The detected phase differences are blocked by the LPF 41 at a low-frequency band, and input to the LC-VCO 42 as voltages. The LC-VCO 42 controls the oscillation frequency according to the voltages output from the LPF 41, and outputs clock signals having four phases (two types of I and Q signals).

The DL 44 receives serial data Din and latches it. The PI 45 mixes sine-wave signals and cosine-wave signals according to the clock signals output from the LC-VCO 42, and applies clock control to the data Din. The DF 46 controls the mixing operation of the PI 45 according to the eye pattern of the data Din. The DEMUX 47 converts the data Din latched by the DL 44 into parallel data and output it as data Dout.

It is necessary to use two sine-wave signals and two cosine-wave signals in the PI 45 for data and a boundary edge. Therefore, clock signals having four phases of 0 degrees, 90 degrees, 180 degrees, and 270 degrees are required.

Figure 7:
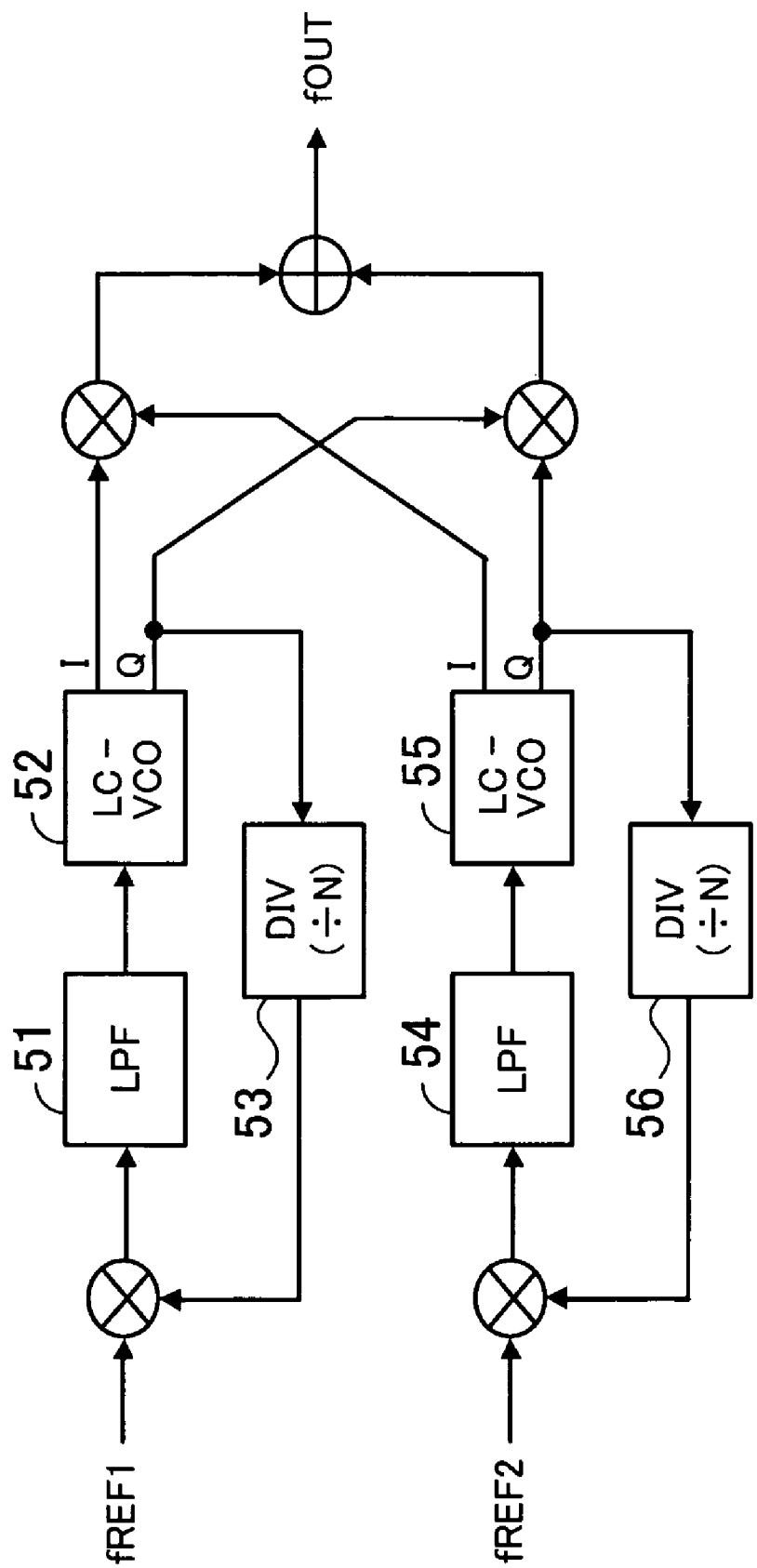
FIG. 7 shows a second example circuit to which the oscillator is applied.

FIG. 7 shows a second example circuit to which the oscillator is applied.

In FIG. 7, a dual synthesizer is shown. The dual synthesizer includes LPFs 51 and 54, LC-VCOs 52 and 55, and DIVs 53 and 56.

The LPF 51, the LC-VCO 52, and the DIV 53 form a PLL, and the LPF 54, the LC-VCO 55, and the DIV 56 form another PLL. Since these PLLs are the same as the PLL described by referring to FIG. 6, a description thereof is omitted. The oscillator of the present invention serves as the LC-VCOs 52 and 55, and outputs clock signals having four phases.

The dual synthesizer is included, for example, in a radio-frequency (RF) transceiver, and needs to have an accurate frequency. The dual synthesizer can change a channel interval and a reference-wave frequency in the RF transceiver with the use of two or more PLLs. To change the channel interval at high precision, a low-frequency signal having a variable frequency is added to a reference high-frequency signal, which is a simple method. When the phase relationship needs to be ensured by I and Q, an oscillator capable of outputting precise clock signals having four phases is important.

As described above, with the use of the phase characteristics of the filters 31 to 34, the signals output from the inverters Z31 to Z34 of the coupling circuit 30 have either a phase lead or a phase lag. Therefore, the phase relationship between the first resonant circuit 10 and the second resonant circuit 20 coupled by the coupling circuit 30 is ensured.

Since the filters 31 to 34 are connected to the input sides (the gates of MOS transistors) of the inverters Z31 to Z34, the phase relationship is ensured without affecting the resonant frequency.

In addition, since the circuits are completely symmetrical, the four-phase clock signals have a good skew precision.

Furthermore, since a constant oscillation frequency is obtained, the oscillator can be applied to high-frequency circuits which require accurate clock signals, such as a high-speed I/O circuit and a dual synthesizer.

Oscillators are divided into a ring-oscillator type in which transistors are used to make a loop and an LC resonance type in which an inductor and a capacitor are used as shown in FIG. 1. Since the LC resonance type receives little effect from device noise and easily implement a high Q value, the LC resonance type is better in terms of jitter characteristics.

The above-described oscillator may be included, for example, in a semiconductor device together with a circuit having another function.

A first embodiment of the present invention will be described next in detail by referring to a figure.

Figure 8:
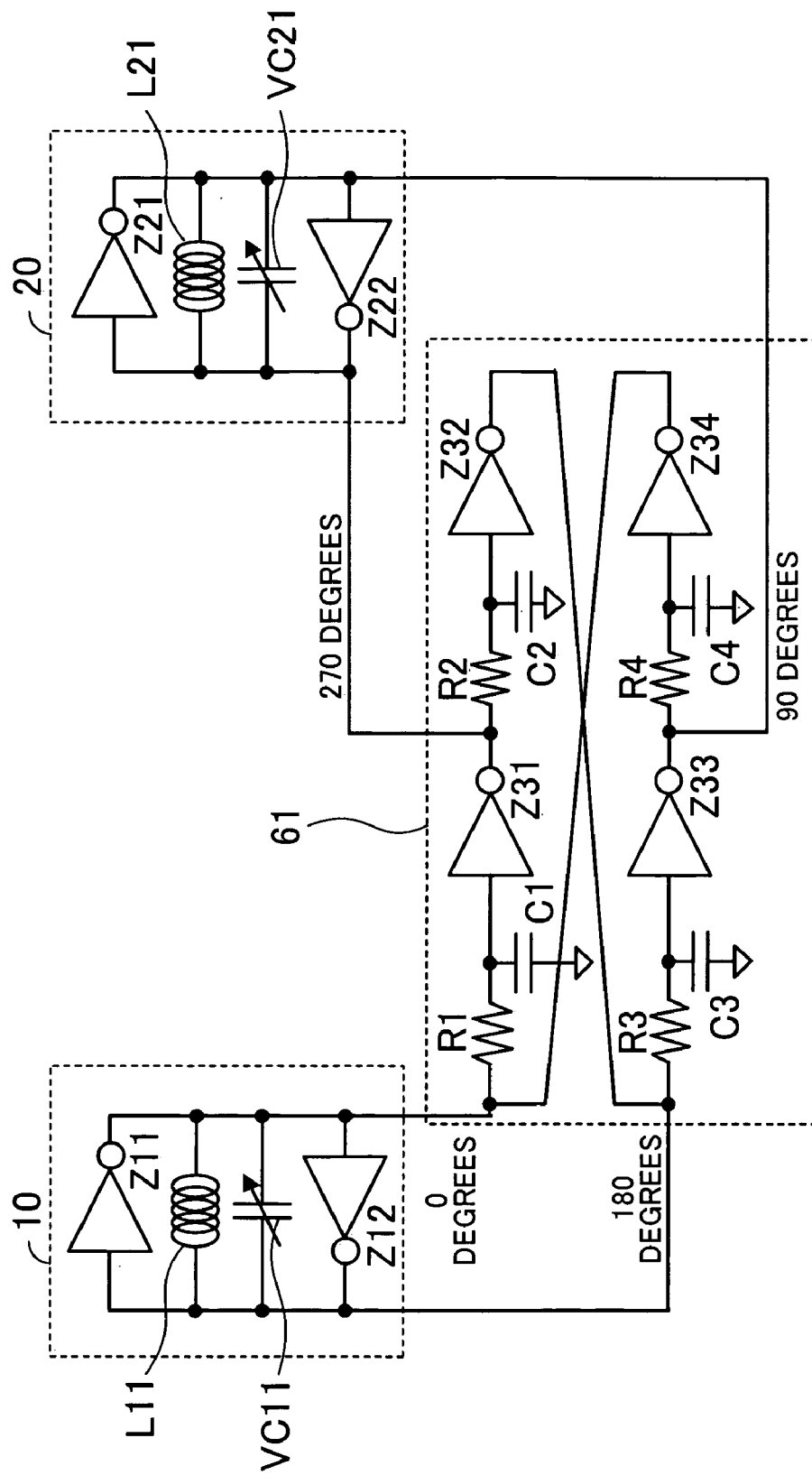
FIG. 8 is a schematic diagram of an oscillator according to a first embodiment.

FIG. 8 is a schematic diagram of an oscillator according to the first embodiment.

In FIG. 8, the same symbols as those used in FIG. 1 are assigned to the same elements as those shown in the oscillator of FIG. 1, and a description thereof is omitted. As shown in FIG. 8, the oscillator is formed of a resonant circuit 10, a resonant circuit 20, and a coupling circuit 61. The first resonant circuit 10 includes inverters Z11 and Z12, an inductor L11, and a variable capacitor VC11. The second resonant circuit 20 includes inverters Z21 and Z22, an inductor L21, and a variable capacitor VC21. The coupling circuit 61 has resistors R1 to R4, capacitors C1 to C4, and inverters Z31 to Z34. A LPF formed of the resistor R1 and the capacitor C1 is connected to the input side of the inverter Z31. A LPF formed of the resistor R2 and the capacitor C2 is connected to the input side of the inverter Z32. A LPF formed of the resistor R3 and the capacitor C3 is connected to the input side of the inverter Z33. A LPF formed of the resistor R4 and the capacitor C4 is connected to the input side of the inverter Z34.

The oscillator in FIG. 8 uses a phase lag of 90 degrees caused by the LPFs each formed of a capacitor and a resistor. Therefore, assuming that a clock signal output from the inverter Z11 has a phase of 0 degrees, a clock signal output from the inverter Z31 has a phase of 270 degrees, which delays by 90 degrees. Clock signals output from the inverters Z32, Z33, and Z34 have phases of 180 degrees, 90 degrees, and 0 degrees, respectively.

As described above, the phase relationship between the two LC resonant circuits coupled by the coupling circuit is ensured with the use of the LPFs each formed of a capacitor and a resistor.

A second embodiment of the present invention will be described next in detail by referring to a figure.

Figure 9:
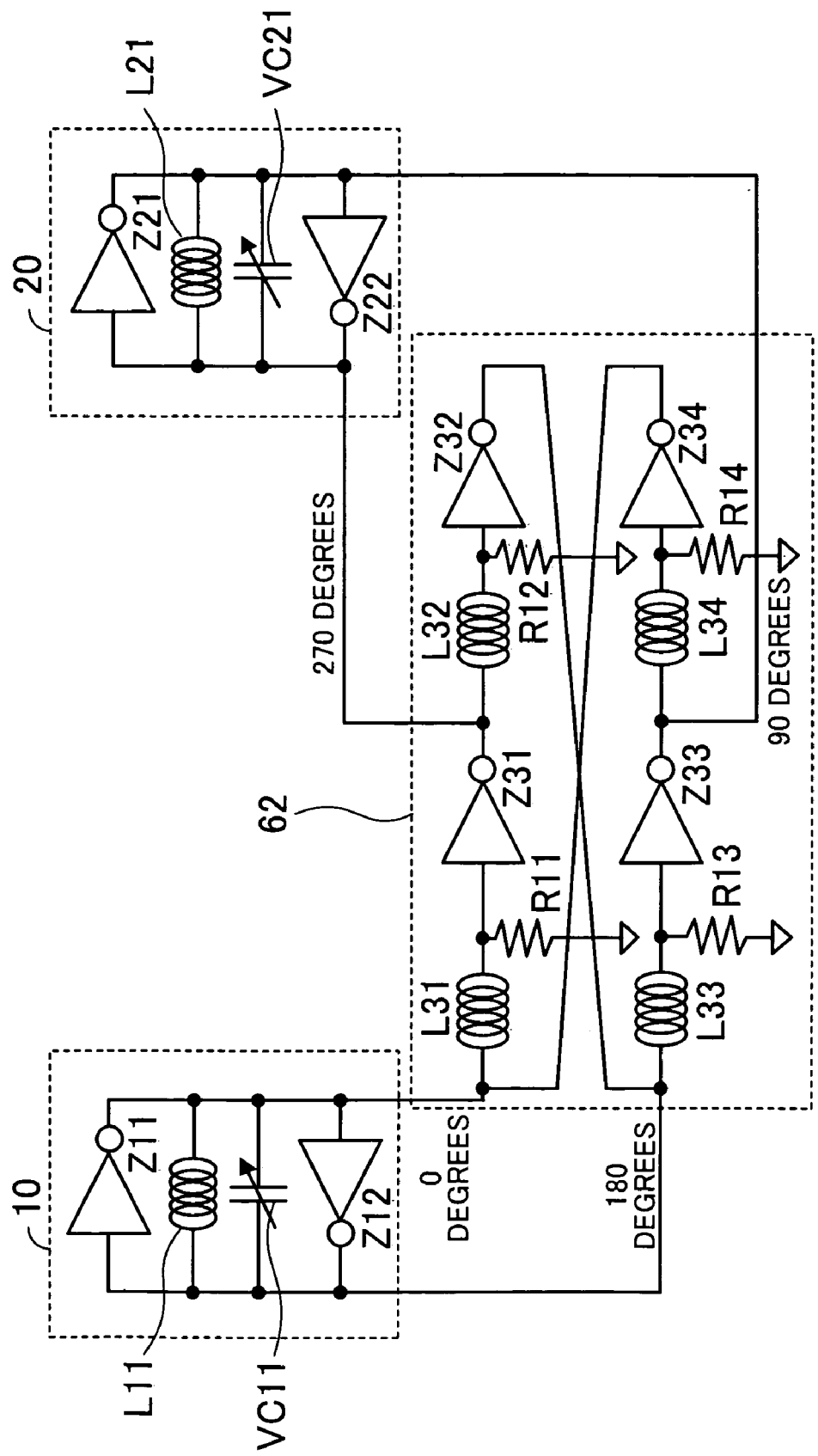
FIG. 9 is a schematic diagram of an oscillator according to a second embodiment.

FIG. 9 is a schematic diagram of an oscillator according to the second embodiment.

In FIG. 9, the same symbols as those used in FIG. 1 are assigned to the same elements as those shown in the oscillator of FIG. 1, and a description thereof is omitted. As shown in FIG. 9, the oscillator is formed of a resonant circuit 10, a resonant circuit 20, and a coupling circuit 62. The first resonant circuit 10 includes inverters Z11 and Z12, an inductor L11, and a variable capacitor VC11. The second resonant circuit 20 includes inverters Z21 and Z22, an inductor L21, and a variable capacitor VC21. The coupling circuit 62 has inductors L31 to L34, resistors R11 to R14, and inverters Z31 to Z34. A LPF formed of the resistor R11 and the inductor L31 is connected to the input side of the inverter Z31. A LPF formed of the resistor R12 and the inductor L32 is connected to the input side of the inverter Z32. A LPF formed of the resistor R13 and the inductor L33 is connected to the input side of the inverter Z33. A LPF formed of the resistor R14 and the inductor L34 is connected to the input side of the inverter Z34.

The oscillator in FIG. 9 uses a phase lag of 90 degrees caused by the LPFs each formed of an inductor and a resistor. Therefore, assuming that a clock signal output from the inverter Z11 has a phase of 0 degrees, a clock signal output from the inverter Z31 has a phase of 270 degrees, which delays by 90 degrees. Clock signals output from the inverters Z32, Z33, and Z34 have phases of 180 degrees, 90 degrees, and 0 degrees, respectively.

As described above, the phase relationship between the two LC resonant circuits coupled by the coupling circuit is ensured with the use of the LPFs each formed of an inductor and a resistor.

A third embodiment of the present invention will be described next in detail by referring to a figure.

Figure 10:
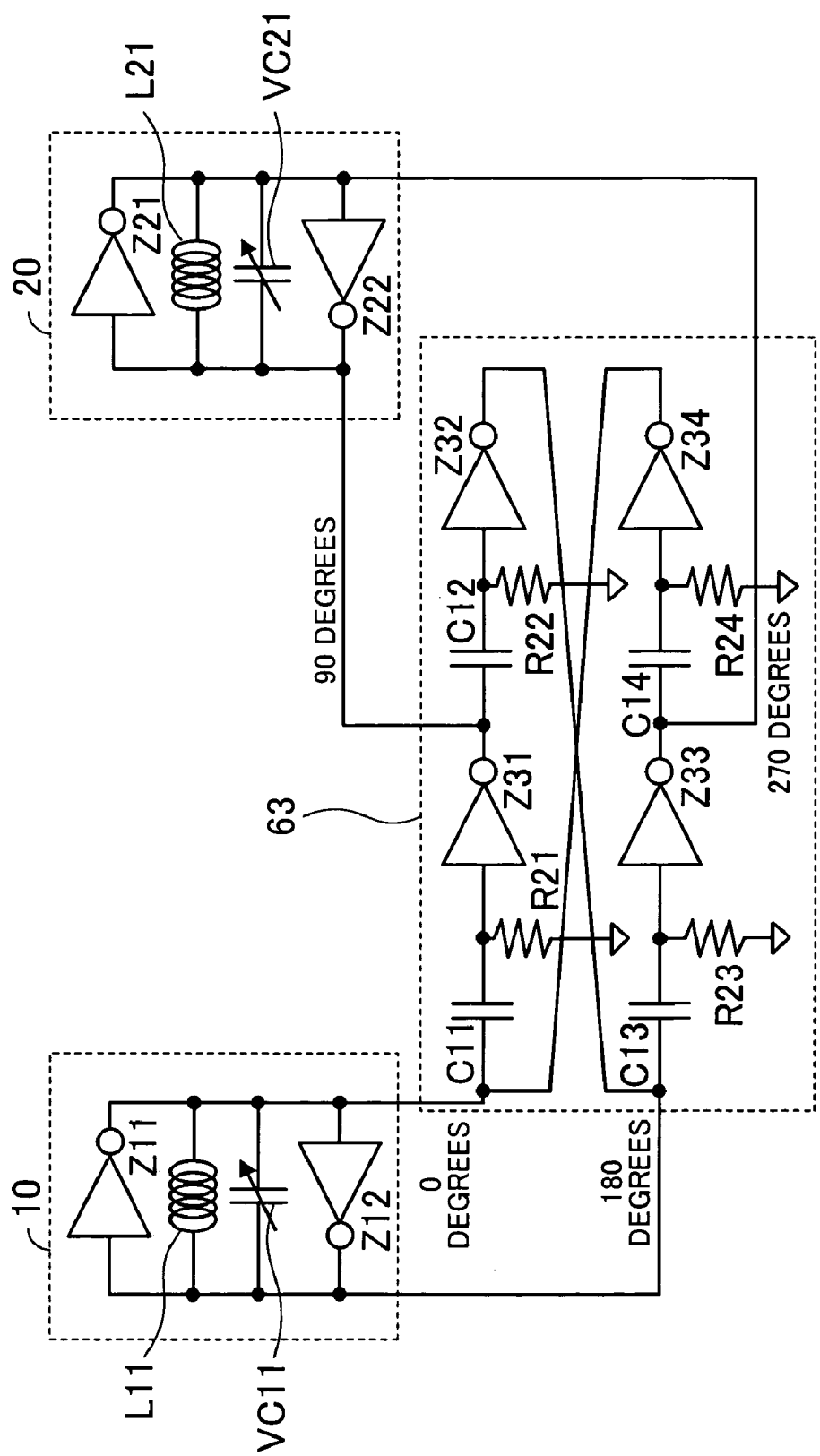
FIG. 10 is a schematic diagram of an oscillator according to a third embodiment.

FIG. 10 is a schematic diagram of an oscillator according to the third embodiment.

In FIG. 10, the same symbols as those used in FIG. 1 are assigned to the same elements as those shown in the oscillator of FIG. 1, and a description thereof is omitted. As shown in FIG. 10, the oscillator is formed of a resonant circuit 10, a resonant circuit 20, and a coupling circuit 63. The first resonant circuit 10 includes inverters Z11 and Z12, an inductor L11, and a variable capacitor VC11. The second resonant circuit 20 includes inverters Z21 and Z22, an inductor L21, and a variable capacitor VC21. The coupling circuit 63 has capacitors C11 to C14, resistors R21 to R24, and inverters Z31 to Z34. A HPF formed of the resistor R21 and the capacitor C11 is connected to the input side of the inverter Z31. A HPF formed of the resistor R22 and the capacitor C12 is connected to the input side of the inverter Z32. A HPF formed of the resistor R23 and the capacitor C13 is connected to the input side of the inverter Z33. A HPF formed of the resistor R24 and the capacitor C14 is connected to the input side of the inverter Z34.

The oscillator in FIG. 10 uses a phase lead of 90 degrees caused by the HPFs each formed of a capacitor and a resistor. Therefore, assuming that a clock signal output from the inverter Z11 has a phase of 0 degrees, a clock signal output from the inverter Z31 has a phase of 90 degrees. Clock signals output from the inverters Z32, Z33, and Z34 have phases of 180 degrees, 270 degrees, and 0 degrees, respectively.

As described above, the phase relationship between the two LC resonant circuits coupled by the coupling circuit is ensured with the use of the HPFs each formed of a capacitor and a resistor.

A fourth embodiment of the present invention will be described next in detail by referring to a figure.

Figure 11:
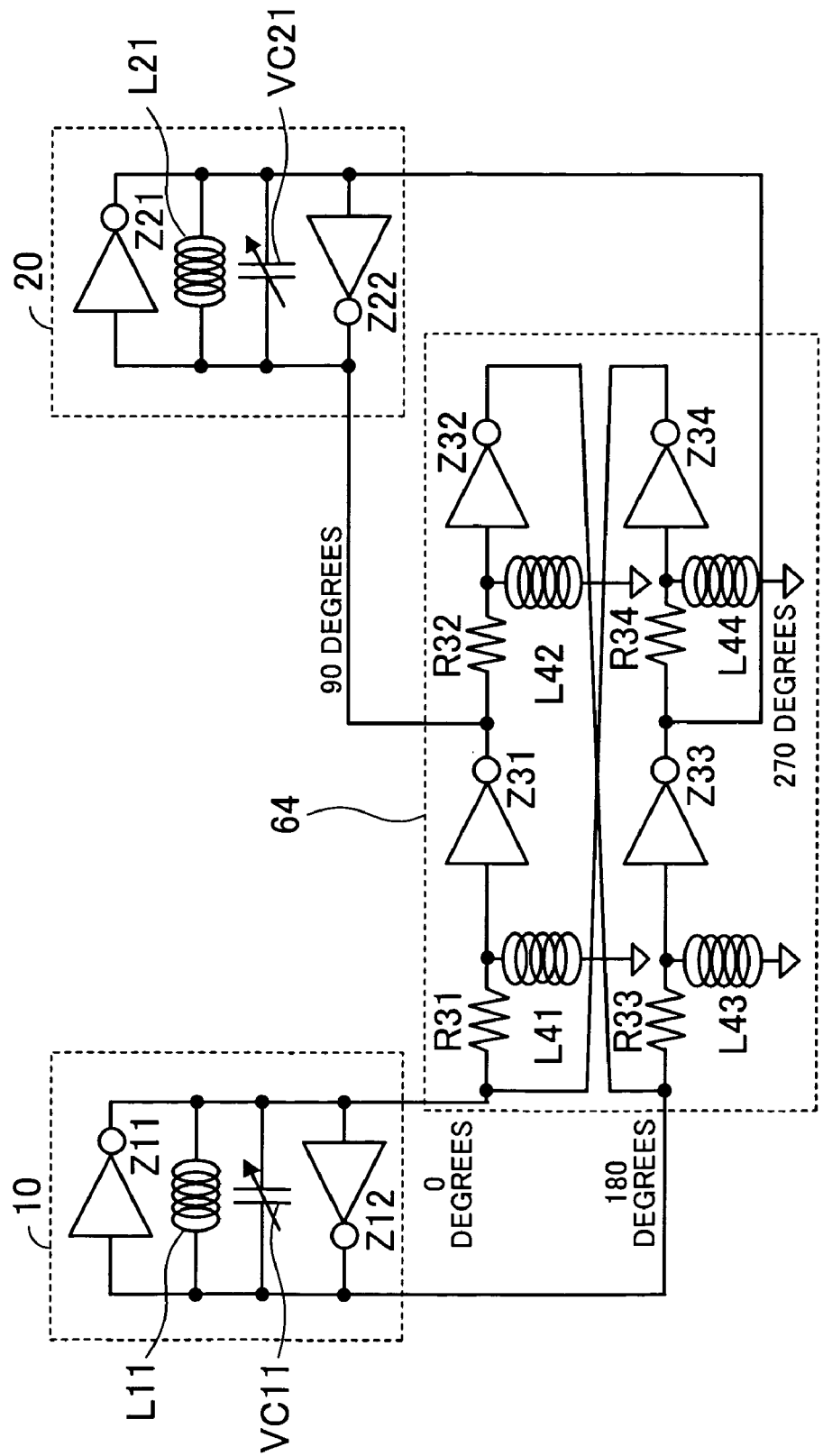
FIG. 11 is a schematic diagram of an oscillator according to a fourth embodiment.

FIG. 11 is a schematic diagram of an oscillator according to the fourth embodiment.

In FIG. 11, the same symbols as those used in FIG. 1 are assigned to the same elements as those shown in the oscillator of FIG. 1, and a description thereof is omitted. As shown in FIG. 11, the oscillator is formed of a resonant circuit 10, a resonant circuit 20, and a coupling circuit 64. The first resonant circuit 10 includes inverters Z11 and Z12, an inductor L11, and a variable capacitor VC11. The second resonant circuit 20 includes inverters Z21 and Z22, an inductor L21, and a variable capacitor VC21. The coupling circuit 64 has resistors R31 to R34, inductors L41 to L44, and inverters Z31 to Z34. A HPF formed of the resistor R31 and the inductor L41 is connected to the input side of the inverter Z31. A HPF formed of the resistor R32 and the inductor L42 is connected to the input side of the inverter Z32. A HPF formed of the resistor R33 and the inductor L43 is connected to the input side of the inverter Z33. A HPF formed of the resistor R34 and the inductor L44 is connected to the input side of the inverter Z34.

The oscillator in FIG. 11 uses a phase lead of 90 degrees caused by the HPFs each formed of an inductor and a resistor. Therefore, assuming that a clock signal output from the inverter Z11 has a phase of 0 degrees, a clock signal output from the inverter Z31 has a phase of 90 degrees. Clock signals output from the inverters Z32, Z33, and Z34 have phases of 180 degrees, 270 degrees, and 0 degrees, respectively.

As described above, the phase relationship between the two LC resonant circuits coupled by the coupling circuit is ensured with the use of the HPFs each formed of an inductor and a resistor.

In the first to fourth embodiments, as the clock signals have a higher frequency, the filters have smaller time constants. Therefore, when the clock signals have a high frequency, the filters each formed of a capacitor and a resistor, or an inductor and a resister can be formed in a small area. The area required for the oscillator is suppressed.

When the time constants become smaller, the phases are determined within a shorter period. The oscillator can output clock signals immediately. In a high-speed I/O circuit of 6.5 Gbps, the phases are determined within several nanoseconds.

Since the phase determination margin of the filters each formed of a capacitor and a resistor or an inductor and a resistor has a range of −90 degrees to +90 degrees, the oscillators can handle variations in processes, temperature fluctuation, and power fluctuation.

A fifth embodiment of the present invention will be described next in detail by referring to a figure.

Figure 12:
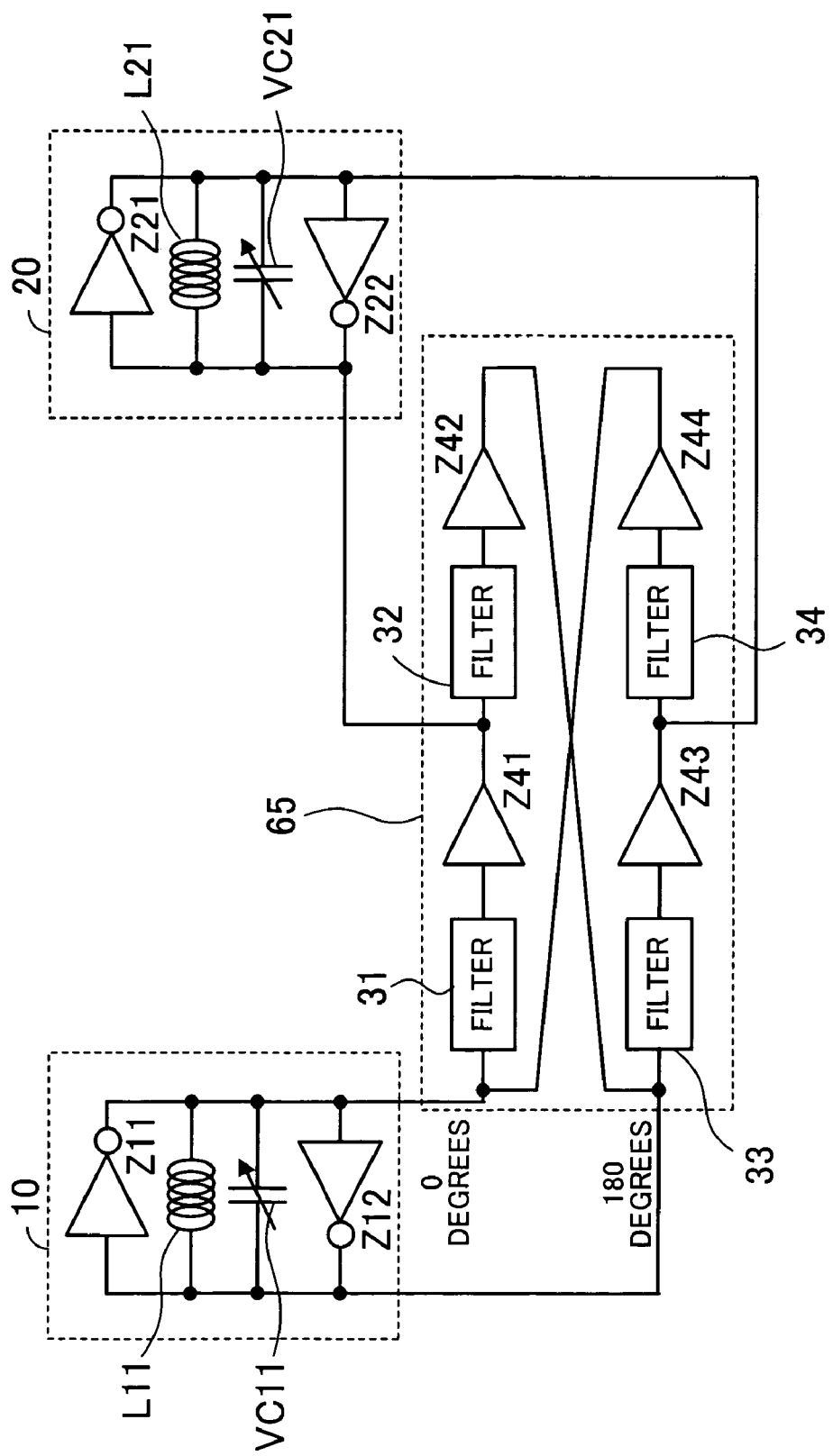
FIG. 12 is a schematic diagram of an oscillator according to a fifth embodiment.

FIG. 12 is a schematic diagram of an oscillator according to the fifth embodiment.

In the fifth embodiment, amplifiers are used instead of inverters in a coupling circuit. More specifically, a phase shift between the input and output of each amplifier is used. In FIG. 12, the same symbols as those used in FIG. 1 are assigned to the same elements as those shown in the oscillator of FIG. 1, and a description thereof is omitted.

As shown in FIG. 12, the oscillator is formed of a resonant circuit 10, a resonant circuit 20, and a coupling circuit 65. The first resonant circuit 10 includes inverters Z11 and Z12, an inductor L11, and a variable capacitor VC11. The second resonant circuit 20 includes inverters Z21 and Z22, an inductor L21, and a variable capacitor VC21. The coupling circuit 65 has filters 31 to 34 and amplifiers Z41 to Z44. The amplifiers Z41 to Z44 are connected in a ring manner. The filter 31 is connected to the input side of the amplifier Z41, the filter 32 is connected to the input side of the amplifier Z42, the filter 33 is connected to the input side of the amplifier Z43, and the filter 34 is connected to the input side of the amplifier Z44. The amplifiers Z41 to Z44 have phase differences between the inputs and outputs.

The filters and the amplifiers are designed such that a phase lead made by the filter 31 and the amplifier Z41, a phase lead made by the filter 32 and the amplifier Z42, a phase lead made by the filter 33 and the amplifier Z43, and a phase lead made by the filter 34 and the amplifier Z44 fall in a range of 0 degrees to 180 degrees. This design corresponds to that for a combination of inverters and HPFs. Assuming that a clock signal input to the filter 31 has a phase of 0 degrees, clock signals output from the inverter Z41, Z42, Z43, and Z44 have phases of 90 degrees, 180 degrees, 270 degrees, and 0 degrees, respectively.

The filters and the amplifiers are designed such that a phase lead made by the filter 31 and the amplifier Z41, a phase lead made by the filter 32 and the amplifier Z42, a phase lead made by the filter 33 and the amplifier Z43, and a phase lead made by the filter 34 and the amplifier Z44 fall in a range of 180 degrees to 360 degrees. This design corresponds to that for a combination of inverters and LPFs. Assuming that a clock signal input to the filter 31 has a phase of 0 degrees, clock signals output from the inverter Z41, Z42, Z43, and Z44 have phases of 90 degrees, 180 degrees, 270 degrees, and 0 degrees, respectively.

As described above, the phase relationship between the two LC resonant circuits coupled by the coupling circuit is also ensured by adjusting the phases by a combination of filters and amplifiers.

Each of the oscillators according to the first to fifth embodiments may be included, for example, in a semiconductor device together with a circuit having another function.

In an oscillator according to the present invention, signals output from inverters of a coupling circuit have either a phase lead or a phase lag by using the phase characteristics of filters. Therefore, the phase relationship between a first resonant circuit and a second resonant circuit coupled by the coupling circuit is ensured.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. An oscillator for outputting four-phase signals, comprising:
   a first resonant circuit for outputting two signals having different phases;
   a second resonant circuit for outputting two signals having different phases;
   a coupling circuit for coupling the first resonant circuit and the second resonant circuit such that the two signals output from the first resonant circuit and the two signals output from the second resonant circuit have different phases, the coupling circuit comprising:
   a plurality of inverters connected in a ring manner; and
   filters each connected to the input side of each of the plurality of inverters, wherein the filters have phase characteristics to provide a phase shift of −90 to 90 degrees.

2. The oscillator according to claim 1, wherein the filters are low-pass filters each comprising a capacitor and a resistor.

3. The oscillator according to claim 1, wherein the filters are low-pass filters each comprising an inductor and a resistor.

4. The oscillator according to claim 1, wherein the filters are high-pass filters each comprising a capacitor and a resistor.

5. The oscillator according to claim 1, wherein the filters are high-pass filters each comprising an inductor and a resistor.

6. The oscillator according to claim 1, wherein: the plurality of inverters are four inverters; and the two signals output from the first resonant circuit and the two signals output from the second resonant circuit are input to the filters with one-to-one correspondence.

7. The oscillator according to claim 1, wherein the filters change a phase by 90 degrees.

8. The oscillator according to claim 1, wherein the first resonant circuit and the second resonant circuit control the oscillation frequencies of the two signals by voltages.

9. An oscillator for outputting four-phase signals, comprising:
   a first resonant circuit for outputting two signals having different phases;
   a second resonant circuit for outputting two signals having different phases;
   a coupling circuit for coupling the first resonant circuit and the second resonant circuit such that the two signals output from the first resonant circuit and the two signals output from the second resonant circuit have different phases, the coupling circuit comprising:
   a plurality of amplifiers connected in a ring manner; and
   filters each connected to the input side of each of the plurality of amplifiers, wherein the filters have phase characteristics to provide a phase shift of −90 to 90 degrees.

10. A semiconductor device for outputting four-phase signals, comprising:
    a first resonant circuit for outputting two signals having different phases;
    a second resonant circuit for outputting two signals having different phases;
    a coupling circuit for coupling the first resonant circuit and the second resonant circuit such that the two signals output from the first resonant circuit and the two signals output from the second resonant circuit have different phases, the coupling circuit comprising:
    a plurality of inverters connected in a ring manner; and
    filters each connected to the input side of each of the plurality of inverters, wherein the filters have phase characteristics to provide a phase shift of −90 to 90 degrees.

11. A semiconductor device for outputting four-phase signals, comprising:
    a first resonant circuit for outputting two signals having different phases;
    a second resonant circuit for outputting two signals having different phases;
    a coupling circuit for coupling the first resonant circuit and the second resonant circuit such that the two signals output from the first resonant circuit and the two signals output from the second resonant circuit have different phases, the coupling circuit comprising:
    a plurality of amplifiers connected in a ring manner; and
    filters each connected to the input side of each of the plurality of amplifiers, wherein the filters have phase characteristics to provide a phase shift of −90 to 90 degrees.

* * * * *